(12) United States Patent
Chua et al.

(10) Patent No.: US 11,527,420 B2
(45) Date of Patent: Dec. 13, 2022

(54) MICRO-FABRICATED, STRESS-ENGINEERED MEMBERS FORMED ON PASSIVATION LAYER OF INTEGRATED CIRCUIT

(71) Applicant: Palo Alto Research Center Incorporated, Palo Alto, CA (US)

(72) Inventors: Christopher L. Chua, San Jose, CA (US); Qian Wang, Mountain View, CA (US); Eugene M. Chow, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 116 days.

(21) Appl. No.: 17/208,322

(22) Filed: Mar. 22, 2021

(65) Prior Publication Data
US 2022/0301891 A1     Sep. 22, 2022

(51) Int. Cl.
*H01L 21/56*   (2006.01)
*H01L 23/532*  (2006.01)
*H01L 23/29*   (2006.01)
*H01L 23/31*   (2006.01)
*H01L 23/482*  (2006.01)
*H01L 23/00*   (2006.01)

(52) U.S. Cl.
CPC ............ *H01L 21/566* (2013.01); *H01L 23/29* (2013.01); *H01L 23/3171* (2013.01); *H01L 23/3192* (2013.01); *H01L 23/4822* (2013.01); *H01L 23/53252* (2013.01); *H01L 24/72* (2013.01)

(58) Field of Classification Search
None
See application file for complete search history.

(56) References Cited

U.S. PATENT DOCUMENTS

| | | | |
|---|---|---|---|
| 5,693,983 A | * | 12/1997 | Ho ............... H01L 23/53257 257/766 |
| 7,349,223 B2 | | 3/2008 | Haemer et al. |
| 7,713,388 B2 | | 5/2010 | Chua et al. |
| 8,530,276 B2 | | 9/2013 | Hilt et al. |
| 8,686,552 B1 | | 4/2014 | Chow et al. |
| 9,955,575 B1 | | 4/2018 | Wang et al. |
| 2005/0133362 A1 | * | 6/2005 | Van Schuylenbergh ........... H01R 12/57 204/192.15 |
| 2007/0023909 A1 | * | 2/2007 | Fork ............... H05K 3/325 257/738 |
| 2008/0251940 A1 | * | 10/2008 | Lee ............... H01L 24/16 257/E23.141 |

(Continued)

*Primary Examiner* — Erik Kielin
(74) *Attorney, Agent, or Firm* — Mueting Raasch Group

(57) ABSTRACT

A release layer is formed on a surface of an integrated circuit wafer. The surface is passivated and includes metal contact materials. A stress-engineered film having an intrinsic stress profile is deposited over the release layer. The stress-engineered film is patterned and the release layer is undercut etched so that a released portion of the patterned stress-engineered film is released from the surface while leaving an anchor portion fixed to the surface. The intrinsic stress profile in the stress-engineered film biases the released portion away from the surface. The released portion is placed entirely within an area defined by the metal contact material.

20 Claims, 7 Drawing Sheets

(56) References Cited

U.S. PATENT DOCUMENTS

| | | | |
|---|---|---|---|
| 2010/0285700 A1* | 11/2010 | Chow | G01R 1/06744 |
| | | | 439/862 |
| 2016/0128206 A9* | 5/2016 | Chow | H05K 3/32 |
| | | | 29/842 |

* cited by examiner

MICRO-FABRICATED, STRESS-ENGINEERED MEMBERS FORMED ON PASSIVATION LAYER OF INTEGRATED CIRCUIT

GOVERNMENT SUPPORT STATEMENT

This invention was made with government support under contract FA8702-15-D0001 awarded by the Department of Defense. The government has certain rights in the invention.

SUMMARY

The present disclosure is directed to micro-fabricated, stress-engineered members on integrated circuits with etchant-sensitive surface passivation layers. In one embodiment, method involves depositing a release layer on a surface of an integrated circuit wafer. The surface comprises passivation and metal contact materials. A stress-engineered film having an intrinsic stress profile is deposited over the release layer. The stress-engineered film is patterned and the release layer is undercut etched so that a released portion of the patterned stress-engineered film is released from the surface while leaving an anchor portion fixed to the surface. The intrinsic stress profile in the stress-engineered film biases the released portion away from the surface. The released portion is placed entirely within an area defined by the metal contact materials.

In another embodiment, an electronic assembly includes a self-contained integrated circuit formed via a first process and comprising a metal contact and a passivation surface. A release layer covers at least part of the metal contact. The assembly includes an elastic member having an extrinsic stress profile. The elastic member includes an anchor portion formed on and coupled to the release layer. The elastic member also includes a free end biased away from the integrated circuit via the intrinsic stress profile to form an out of plane structure. The free end is disposed entirely within an area defined by the metal contact. The free end is operable to electrically interface with a contact of a second circuit assembly.

In another embodiment, a method involves providing a self-contained integrated circuit that is formed via a first process. An elastic member is formed on the integrated circuit via a second process. The second process involves: depositing a release layer on a passivation surface and metal contact of the integrated circuit; forming an elastic member on the release layer, the elastic member having an intrinsic stress profile; covering the release layer and the elastic member with a photoresist; forming an opening in the photoresist over the elastic member, the opening entirely within an area defined by the metal contact; and undercut etching the release layer through the opening to form a free end while leaving an anchor portion fixed to the release layer. The intrinsic stress profile in the elastic member biases the free end of the elastic member away from the integrated circuit to form an out of plane structure upon release of the free end.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
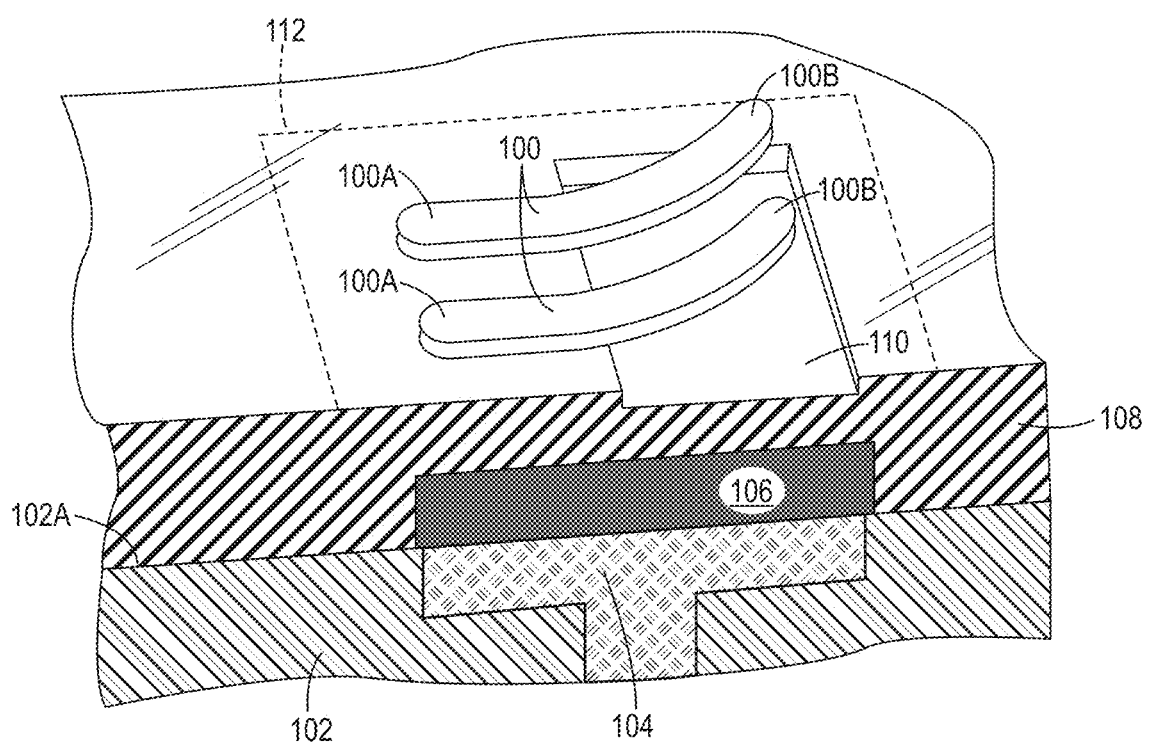
FIG. 1 is a perspective view of an device that can be manufactured by a method according to an example embodiment.

The present disclosure is generally related to the fabrication of electrical devices that utilize integrated circuits (ICs). Integrated circuits are manufactured on a wafer that is divided into individual chips. In some packaging configurations, each chip is put into an enclosure where it is wire bonded to terminals that are located on an exterior of the enclosure. The terminals may be metal leads configured for thru-hole or surface mount. Integrated circuit packages of this type are typically assembled with other electronic components by being soldered to traces on a circuit board.

As devices have become smaller and ICs more complex, it has become difficult to achieve design targets for some device using conventional circuit board attachment of ICs. One mounting method employed to counter these disadvantages is known as flip-chip mounting. Flip-chip involves depositing conductive pads for the power and signal lines on the top surface of an IC, which is then flipped over to a mounting board that has corresponding pads on a mounting surface. A reflow operation is performed which bonds the IC to the board and establishes the electrical connections between the pads. The chip may have minimal or no enclosure, e.g., just having a coating or passivation layers to protect the chip layers from the environment.

Among the advantages of flip-chip assembly is the ability to form compact final assemblies with short signal lines, and adaptability to high-speed assembly processes. Flip-chip bonding has some disadvantages, though. Such assemblies are not well-suited for easy replacement, or unaided manual installation. The short connections formed by the bonded pads are very stiff, so if the thermal expansion of the chip is not well matched to the supporting board, the connections can fracture. Also, if the mounting surface of the board is not very flat, some connections may fail to bond due to insufficient contact between the pads.

In order to provide the advantages of flip-chip assembly and counter some of the disadvantages, a system has been developed to use non-soldered connections in a flip-chip style assembly. This involves forming conductive springs that extend out of the pads of a mounting surface and/or IC. This can result in a multi-chip module assembly that is compact with short conductor runs, yet can still be assembled and reworked more easily than a bonded assembly. The flexible springs are more forgiving of variation in surface flatness thus is less likely to experience mechanical stress if the mated devices have different rates of thermal expansion.

In order to fabricate springs at such a small scale, techniques have been developed to use wafer production processes to form these springs on wafer substrates. For example, U.S. Pat. No. 9,955,575, dated Apr. 24, 2018, describes methods for producing out of plane structures (e.g., coils) that can be used in microelectronic circuits. Generally, a film is deposited with stress engineered layers onto an electronic device. The film has elastic portions with a non-uniform stress profile through its thickness such that the stress engineered film curls upward when one end is released, e.g., via undercut etching the end while keeping another end of the film anchored.

Electronic devices can benefit from the addition of micro-spring contacts on their surfaces, allowing the devices to be easily assembled into compact, multi-chip modules. One issue is that the fabrication of the springs onto commercially-available IC packages may involve the use of chemicals (e.g., etchants) that can damage some circuit substrates. While specially-designed ICs can include materials that are resistant to these chemicals, the system designer may have to choose from commercially-available ICs that may not be designed for this specific use, and therefore could be damaged during micro-spring formation process. Therefore, systems and methods are described below that can fabricate micro-spring contacts to a commercially-available, self-contained IC package without risking damage to the IC.

In FIG. 1, a cutaway view shows an example of microfabricated springs 100 according to an example embodiment. The springs 100 (are also referred to herein as elastic members) are formed on an IC wafer 102, which has a passivation surface 102a that is used as a substrate for building the springs 100. The IC wafer 102 may be formed at a first facility using a first process (e.g., silicon wafer fabrication) and can be shipped as a self-contained unit to another facility to have the springs added in a second process. A metal contact 104 extends to the passivation surface 102a, and is part of an electrical path that couples internal components of the IC 102 (e.g., on-chip circuitry) to another electrical device (e.g., another IC, an interposer, etc.). When interfacing the IC 102 with the other electrical device, the free end of the spring 100 deflects when contacting a contact of the electrical device and forms an electrical path therebetween. The IC 102 may have a large number of these metal contacts 104, e.g., arranged on a grid pattern on an outer surface of the IC 102.

The IC 102 and metal contact 104 are provided by a manufacturer as an integrated electronics package. The remaining elements shown in FIG. 2 can be applied later in the second process, e.g., at a second manufacturing facility, and to custom specifications. The metal contact 104 may optionally be covered by a protective metal layer 106 as part of this second process to provide protection for the IC 102 as described in greater detail below. The protective metal layer 106 may not be needed when the metal contact 104 is formed of a material that is resistant to the processes used to form the spring 100. The optional protective metal layer 106 is made of a different material than the metal contact 104, and may be the same or different size than that of the metal contact 104. In this example, the protective metal layer 106 is slightly larger than the metal contact 104, although the protective metal layer 106 could be smaller so long as it and other process materials protect the metal contact 104 from etchants and/or other chemicals used to form the springs 100.

In some embodiment, the metal contact 104 and/or protective metal layer 106 can be made of a noble metal such as gold (Au) or an alloy thereof. Besides providing protection to the IC 102, this metal will also be a conductive path between the springs 100 and the IC 102. Thus Au is a good candidate for the metal contact 104 because of its high electrical conductivity and resistance to oxidation. Other noble metals could be used (e.g., Pt, Ag) for the metal contact 104, and in some embodiments, e.g., depending on the subsequent etching chemicals used for the springs 100, a non-noble metal could be used (e.g., Cu, Ti). If the metal contact 104 is formed of a metal such as Al that could be damaged by the etching chemical, then the protective metal layer 106 formed of an appropriate material noted above could be added.

A release layer 108 is shown formed over the protective metal layer 106. The release layer 108 can be a metal (e.g., Ti, an alloy of Ti) that electrically conducts between the metal contact 104 and the springs 100. The release layer 108 may also be a non-metal (e.g., $Si_xO_yN_z$, where x, y, and z are fractional constituents less than or equal to 1), and additional features (e.g., metallic vias) may be formed to electrically couple the springs 100 to the metal contact 104. The release layer 108 has a number of functions. First, the release layer 108 anchors a first end 100a of the springs to the IC 102. Second, the release layer 108 can be undercut etched without etching or otherwise damaging the springs 100, allowing the springs 100 to deform out-of-plane as seen in the figure.

In embodiments described below, a layer of the stress-engineered material is formed over the release layer 108. The layer of stress-engineered material is patterned and etched to form the outline shape of the springs 100. Then the release layer material in region 110 is undercut etched, releasing ends 100b from the layer 108 and allowing them to deform as shown. Note that the release layer 108 may cover a large number of metal contacts similar to 104, and if formed of a conductive material, would short the pads if the release layer 108 was left covering all of them. Therefore, a final etching may be performed on the release layer 108 following this stage, where only a portion of the release layer 108, indicated by dashed line 112, will remain in place over the metal contact 104 in order to continue anchoring the springs 100.

Figure 2:
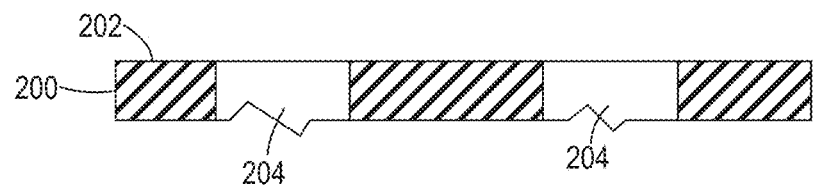
FIGS. 2-9 are diagrams illustrating a manufacturing process according to an example embodiment.

In FIGS. 2-10, diagrams show details of forming microsprings according to an example embodiment. As seen in FIG. 2, a passivation surface 202 of an IC 200 is prepared as a substrate. Generally, the passivation surface 202 is a layer of the wafer material (e.g., Si) that has been passivated, e.g., oxidized or coated with an oxide layer. The passivation surface 202 provides a protective coating for the electronics formed within the IC 200. Preparation of the passivation surface 202 as shown in FIG. 2 could include cleaning, planarizing, re-passivating, etc.

Figure 3:
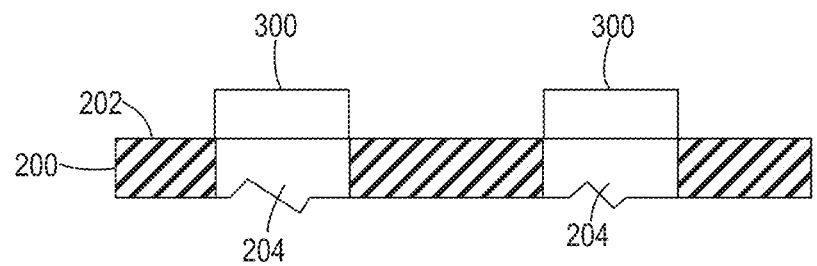

One or more metal contacts 204 extend to the passivation surface 202, and are coupled to internal components (not shown) of the IC 200. The metal contacts 204 serve as electronic interfaces that allow the IC 200 to communicate with other circuitry, and may provide other functions as well (e.g., supply power, electromagnetic shielding, heat sinking, etc.). As seen in FIG. 3, protective metal layers 300 are optionally formed on each of the metal contacts 204. The protective metal layers 300 may be formed of a noble metal, e.g., Au or alloys thereof, and may also extend beyond the metal contacts 204 or be smaller than the metal contacts 204. If the metal contacts 204 are already formed of a metal (e.g., noble metal) that provides sufficient protection, then the protective metal layers 300 may not be needed.

The formation of the protective metal layers 300 may involve depositing a layer of the metal across the passivation surface 202, depositing a photoresist over the protective metal layer, and exposing parts of the photoresist to a pattern of optical energy, e.g., via photolithography or laser patterning. This can harden or soften parts of the photoresist, where the relatively harder parts of the photoresist form the desired pattern. The softer parts of the photoresist can be removed (e.g., via ashing or using a solvent) and the remaining portions of the photoresist defines the desired shapes, in this case the shapes of the protective metal layers 300. Another removal process (e.g., chemical etching, ion-beam etching)

can be used to remove the exposed metal not covered by the photoresist. The photoresist is then removed, leaving the protective metal layers 300 shaped as shown in FIG. 3.

Figure 4:
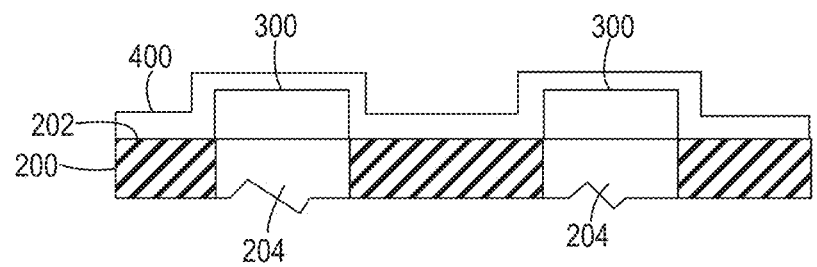

As seen in FIG. 4, a release layer 400 is deposited on the passivation surface 202 and protective metal layers 300. Note that if the protective metal layers 300 are not used, then the release layer 400 would be deposited directly over the metal contacts 204. The release layer 400 may be formed of Ti or alloys thereof, for example. In some embodiments, the release layer 400 is between 20 to 50 nm thick. In cases where the metal contacts 204 or optional protective metal layers 300 are formed of a noble metal such as Au, there may be difficulty in getting the release layer 400 to adhere to the noble metal. In such a case, the passivation surface 202 and protective metal layers 300 may be activated by bombardment with a stream of noble gas atoms, e.g., Ar and ions of Ar. Together with the gas stream, a part of a release layer 400 is deposited on the passivation surface 202 and metal contacts 204 or protective metal layers 300. Then a remainder of the release layer 400 is deposited without the gas stream.

Figure 5:
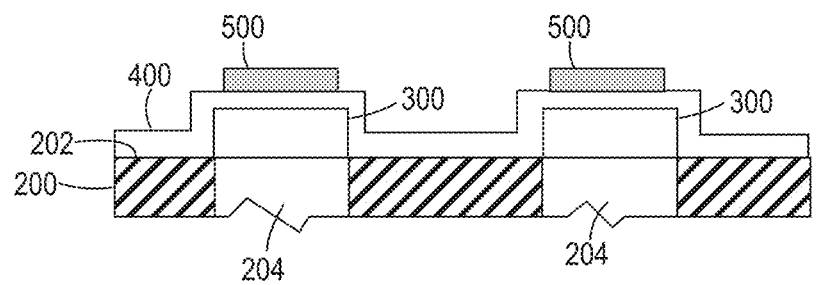
Figure 6:
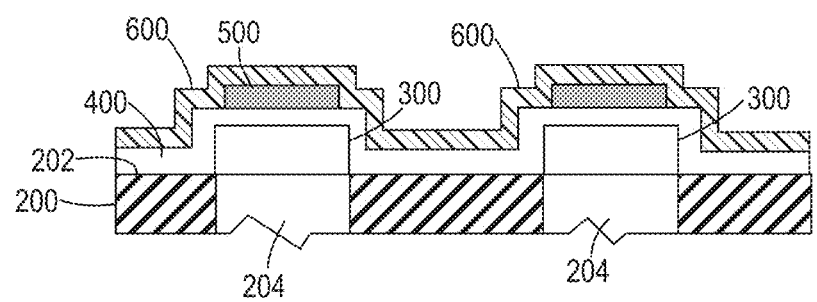
Figure 7:
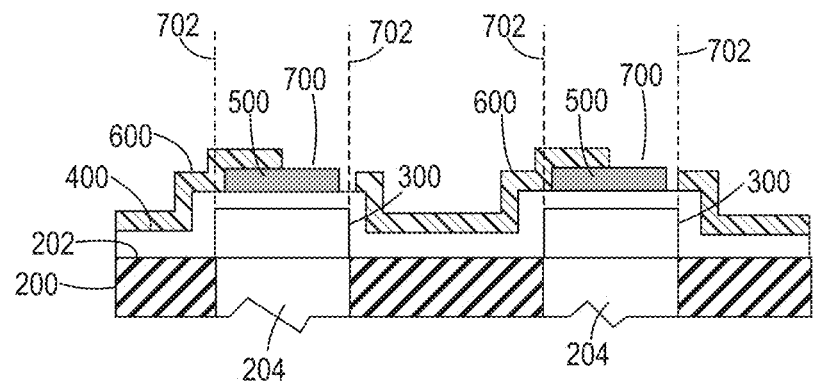

As seen in FIG. 5, a stress-engineered film 500 is formed on the release layer 400 over each of the metal contacts 204 or optional protective metal layers 300. The stress-engineered film 500 has an intrinsic stress profile that will cause it to deform if not constrained. In one embodiment, the stress-engineered film 500 is formed by a multi-layer structure with alloys of molybdenum and chrome. As shown in FIG. 5, the stress-engineered film has been patterned to a target shape, e.g., elastic member, spring, etc. As seen in FIG. 6, the release layer 400 and stress-engineered film 500 are covered with a photoresist 600. Then, as seen in FIG. 7, openings 700 are formed in the photoresist 600 over the stress-engineered film 500. The openings 700 can be formed by exposure to light energy, followed by solvent, ashing, etc. The openings 700 are within an area defined by the metal contacts 204 or protective metal layers 300, as indicated by dotted lines 702. Note that there are different ways of patterning films and the use of photoresist 600 is only one way. For example, a protective material may be layered over the release layer 400 and stress-engineered film 500 and the openings defined by laser ablation.

Figure 8:
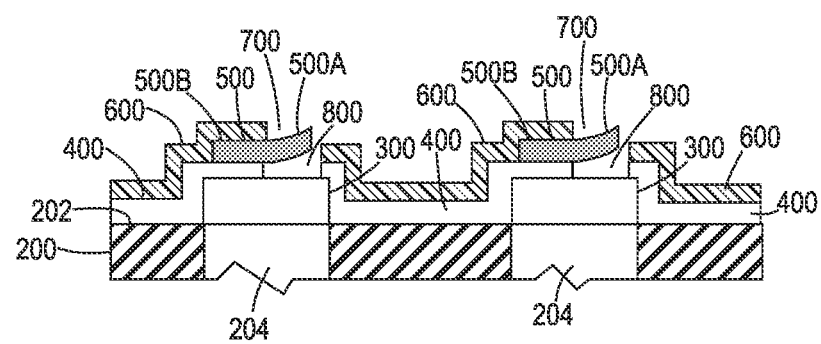

As seen in FIG. 8, an undercut etch has been performed through the openings 700 which removes a portion of the release layer 400 as indicated by trenches 800. The undercut etching releases a free end 500a of the stress-engineered film 500 while leaving an anchor portion 500b of the stress-engineered film 500 fixed to the release layer 400. The metal contacts 204 (or protective metal layers 300 if used) and remaining photoresist 600 protect the IC 200 and metal contacts 204 during the undercut etch.

The intrinsic stress profile in the stress-engineered film 500 biases the free end 500a away from the substrate after the undercut etch to form an out of plane structure upon release of the free end 500a. In this example, the out of plane structure is an arcuate spring, although other shapes may be formed, e.g., circular half-loops. In FIG. 8, the trenches 800 formed by the undercut etching are shown extending to the protective metal layers 300 such that the protective metal layers 300 are exposed. While this deep of an etch may not be required, if it occurs intentionally or not, the photoresist 600 and the protective metal layers 300 (or metal contacts 204 if protective layers 300 are not used) will protect the passivation surface 202 from an etchant (e.g., hydrofluoric acid) used during the undercut etching of the release layer 400.

Figure 9:
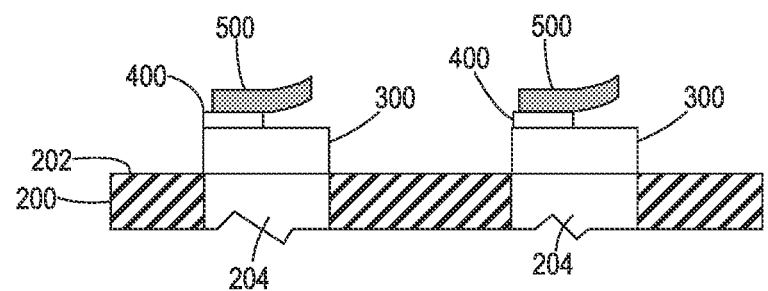

As seen in FIG. 9, an etching process has removed the uncovered parts of the release layer. In order to prevent damage to the IC 200, the etch used to remove the uncovered parts of the release layer may be performed using a selective etchant such as $NH_4OH:H_2O_2$ (1:2). In some embodiments, the release layer 400 is between 20 to 1000 nm thick. In some embodiments, the metal pad and springs can be micron scale. In some embodiments, the out of plane structure extends out of plane by 2 µm to 600 µm. Note that the forming of the elastic members may be formed on full wafer that includes many ICs. Afterwards, the wafer can be singulated into the individual IC packages that are each integrated into an electronic assembly using the out-of-plane structures as metal contacts.

Figure 10:
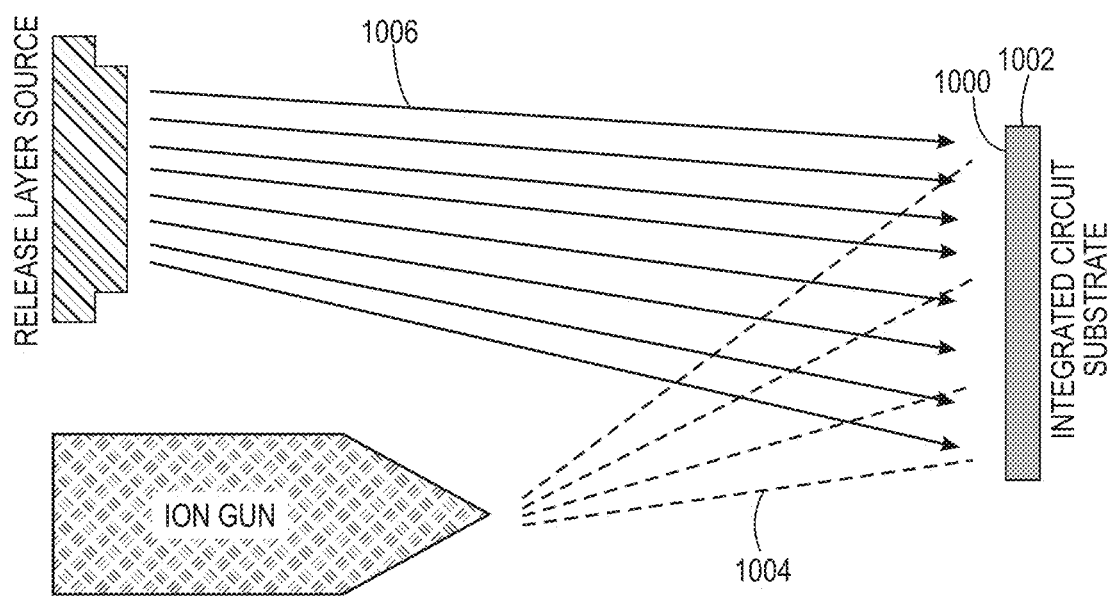
FIG. 10 is a diagram illustrating the deposition of a release layer according to an example embodiment.

In FIG. 10, a diagram shows ion bombardment and co-deposition of the release layer according to an example embodiment. Depositing the release layer involves activating the surface 1000 of an IC wafer 1002 with an accelerated stream of atoms 1004. While bombarding the surface with the stream of atoms 1004, a part of the release layer is deposited on the surface via material stream 1006. A remainder of the release layer is deposited without the atom bombardment. At least a portion of the stream of atoms 1004 may be ionized. The ion stream 1004 an Ar stream and the release layer may comprises one of Ti, an alloy of Ti, or, $Si_xO_yN_z$, where x, y, and z are fractional constituents between 0 and 1, and x, y, and z sum to 1.

Figure 11:
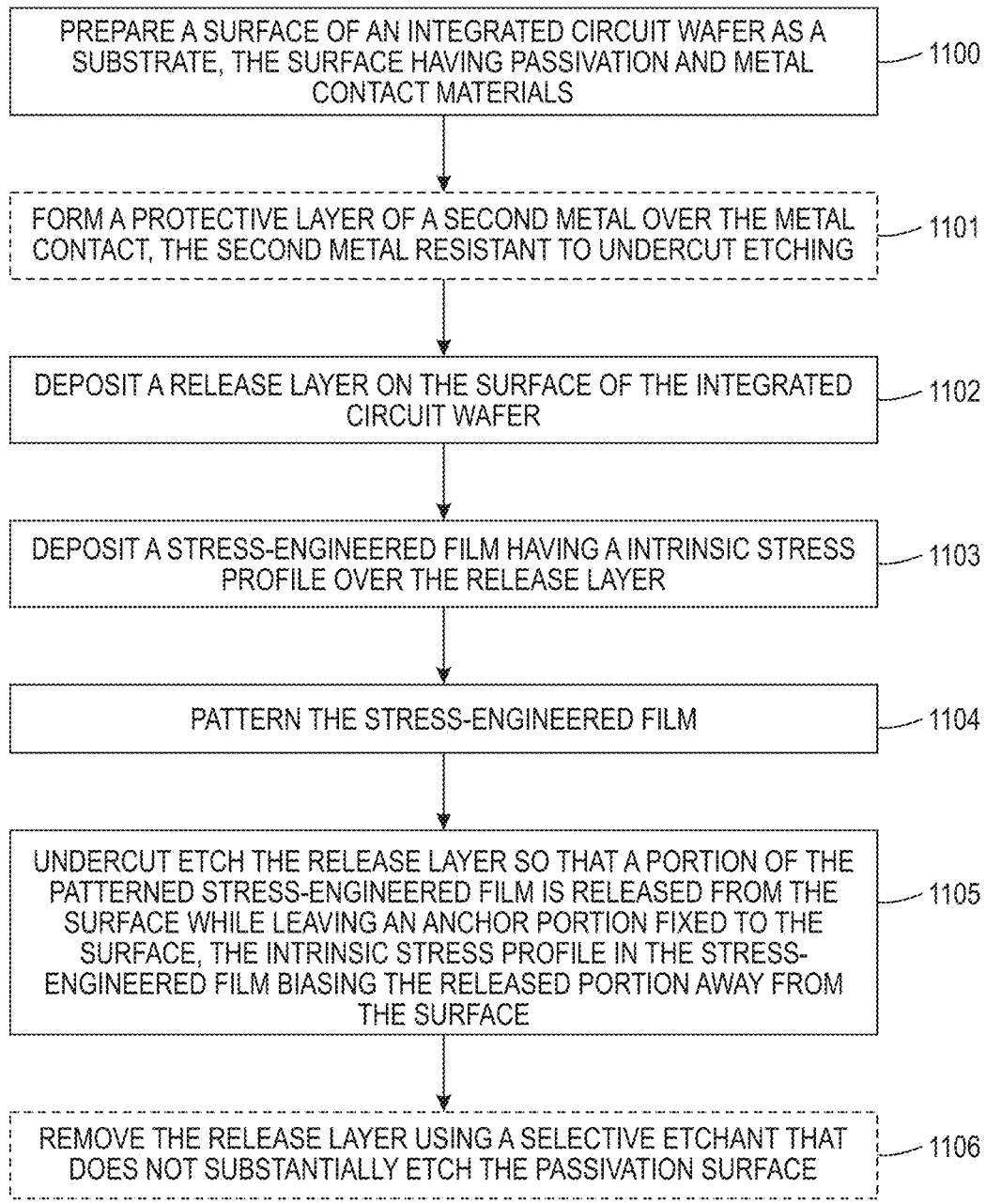
FIGS. 11 and 12 are flowcharts of methods according to example embodiments.

In FIG. 11, a flowchart shows a method according to an example embodiment. The method involves preparing 1100 a surface of an integrated circuit wafer as a substrate. The surface having passivation and metal contact materials. Optionally, a protective layer of a second metal may be formed 1101 over the metal contact. The second metal is resistant to undercut etching. A release layer is deposited 1102 on the surface of the integrated circuit wafer. A stress-engineered film having an intrinsic stress profile is deposited 1103 over the release layer. The stress-engineered film is patterned 1104.

The release layer is undercut etched 1105 so a portion of the patterned stress-engineered film is released from the surface while leaving an anchor portion fixed to the surface. The intrinsic stress profile in the stress-engineered film biases the released portion away from the surface. The released portion is placed entirely within an area defined by metal contact materials. The release layer may be removed 1106 using a selective etchant that does not substantially etch the passivation surface. If the release layer is made of an insulator, removal 1106 is optional.

Figure 12:
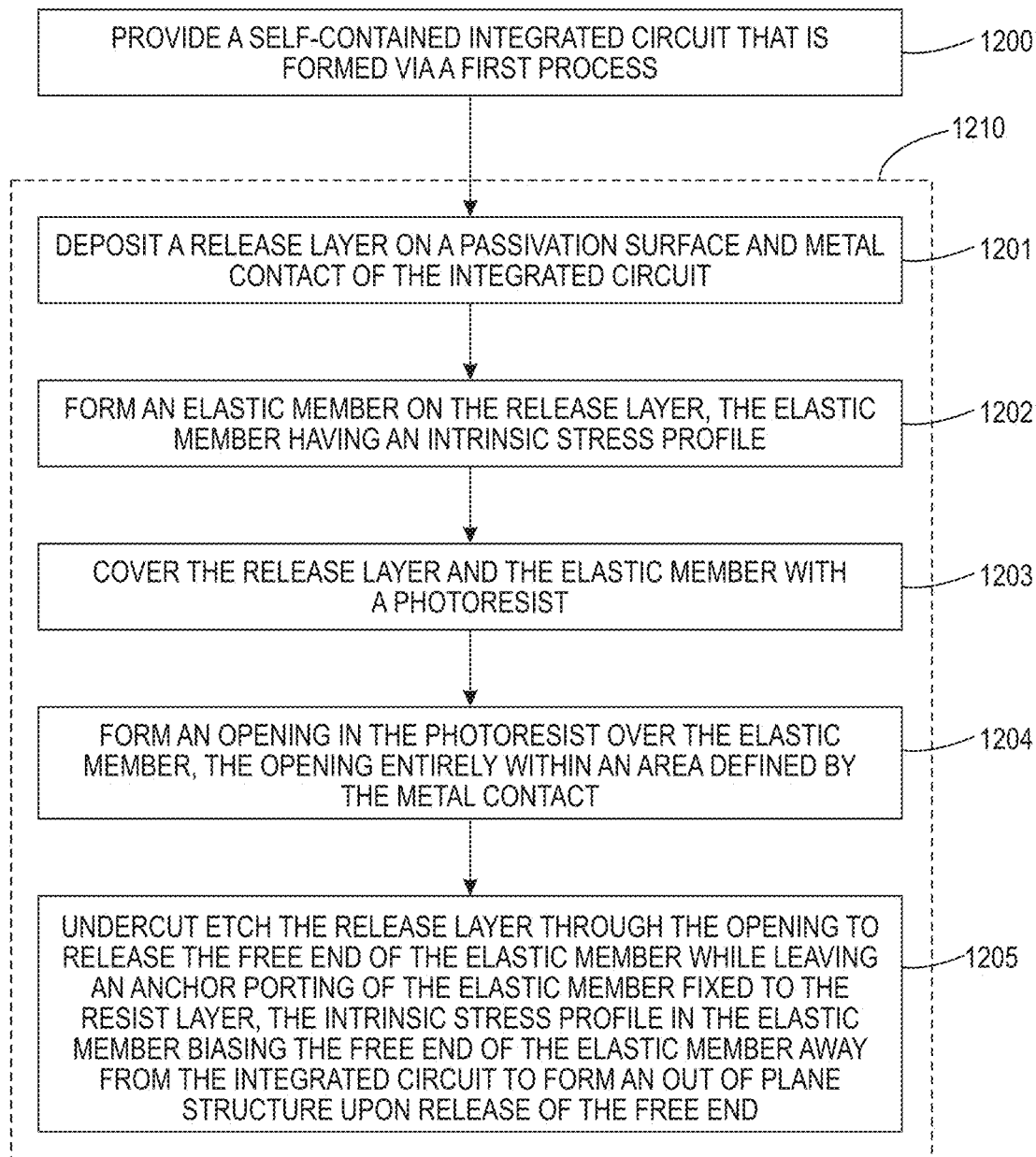

In FIG. 12, a flowchart shows a method according to another example embodiment. The method involves providing 1200 a self-contained integrated circuit that is formed via a first process, e.g., a silicon wafer deposition process. An elastic member is formed on the integrated circuit via a second process 1210. The second process 1210 includes depositing 1201 a release layer on a passivation surface and metal contact of the integrated circuit. An elastic member is formed 1202 on the release layer. The elastic member has an intrinsic stress profile. The release layer and the elastic member are covered 1203 with a photoresist. An opening is formed 1204 in the photoresist over the elastic member, the opening entirely within an area defined by the metal contact. The release layer is undercut etched through the opening to form a free end of the elastic member while leaving an anchor portion of the elastic member fixed to the resist layer. The intrinsic stress profile in the elastic member biases the free end of the elastic member away from the integrated circuit to form an out of plane structure upon release of the free end.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method comprising:
activating a surface of an integrated circuit wafer with an accelerated stream of atoms, the surface comprising passivation and metal contact materials;
while bombarding the surface with the stream of atoms, depositing a part of a release layer on the surface;
depositing a remainder of the release layer without the atom bombardment;
depositing a stress-engineered film having an intrinsic stress profile over the release layer;
patterning the stress-engineered film; and
undercut etching the release layer so that a released portion of the patterned stress-engineered film is released from the surface while leaving an anchor portion fixed to the surface, the intrinsic stress profile in the stress-engineered film biasing the released portion away from the surface, the released portion placed entirely within an area defined by the metal contact materials.

2. The method of claim 1, where the anchor portion is entirely within the area defined by the metal contact materials.

3. The method of claim 1 further comprising removing the release layer using a selective etchant that does not substantially etch the passivation surface.

4. The method of claim 3 wherein the selective etchant comprises $NH_4OH$ and $H_2O_2$.

5. The method of claim 1, wherein the metal contact materials comprise noble metal contacts.

6. The method of claim 5, wherein the noble metal contacts comprise Au or alloys thereof.

7. The method of claim 1 wherein the stress-engineered film comprises an alloy of molybdenum and chrome.

8. The method of claim 1, wherein at least a portion of the stream of atoms are ionized.

9. The method of claim 8, wherein the stream of atoms comprises an Ar stream.

10. The method of claim 1, wherein the release layer comprises one of Ti, an alloy of Ti, or, $Si_xO_yN_z$, where x, y, and z are fractional constituents between 0 and 1.

11. The method of claim 1, further comprising forming a layer of a second metal over the metal contact materials prior to depositing the release layer, the second metal resistant to the undercut etching.

12. The method of claim 1, wherein the released portion comprises an arcuate spring.

13. The method of claim 12, wherein the released portion extends out of plane by 2 μm to 600 μm.

14. A method comprising:
depositing a release layer on a surface of an integrated circuit wafer, the surface comprising passivation and metal contact materials, wherein the release layer comprises Ti or an alloy thereof;
depositing a stress-engineered film having an intrinsic stress profile over the release layer;
patterning the stress-engineered film;
undercut etching the release layer so that a released portion of the patterned stress-engineered film is released from the surface while leaving an anchor portion fixed to the surface, the intrinsic stress profile in the stress-engineered film biasing the released portion away from the surface, the released portion placed entirely within an area defined by the metal contact materials; and
after undercut etching the release layer, removing a second portion of the release layer using a chemical comprising $NH_4OH$ and $H_2O_2$.

15. A method comprising:
providing a self-contained integrated circuit that is formed via a first process; and
forming an elastic member on the integrated circuit via a second process comprising:
depositing a release layer on a passivation surface and metal contact of the integrated circuit;
forming the elastic member on the release layer, the elastic member having an intrinsic stress profile;
covering the release layer and the elastic member with a photoresist;
forming an opening in the photoresist over the elastic member, the opening entirely within an area defined by the metal contact;
undercut etching the release layer through the opening to form a free end while leaving an anchor portion fixed to the release layer, the intrinsic stress profile in the elastic member biasing the free end of the elastic member away from the integrated circuit to form an out of plane structure upon release of the free end; and
after undercut etching the release layer, removing the release layer using a selective etchant that does not substantially etch the passivation surface.

16. The method of claim 15, further comprising interfacing the integrated circuit with an electrical device such that the free end of the elastic member deflects when contacting a contact of the electrical device and forms an electrical path therebetween.

17. The method of claim 15, wherein depositing the release layer comprises:
activating the passivation surface with an accelerated stream of atoms;
while bombarding the passivation surface with the stream of atoms, depositing a part of the release layer on the passivation surface; and
depositing a remainder of the release layer without the atom bombardment.

18. The method of claim 17, wherein at least a portion of the stream of atoms are ionized.

19. The method of claim 18, wherein the stream of atoms comprises an Ar stream.

20. The method of claim 17, wherein the release layer comprises one of Ti, an alloy of Ti, or, $Si_xO_yN_z$, where x, y, and z are fractional constituents between 0 and 1.

* * * * *